United States Patent

Yamamoto et al.

[11] Patent Number: 4,760,339
[45] Date of Patent: Jul. 26, 1988

[54] NMR IMAGING METHOD

[75] Inventors: Etsuji Yamamoto, Akishima; Koichi Sano, Sagamihara; Hidemi Shiono, Akikawa; Hideki Kohno, Tokyo, all of Japan

[73] Assignee: Hitachi, Ltd., Tokyo, Japan

[21] Appl. No.: 944,001

[22] Filed: Dec. 22, 1986

[30] Foreign Application Priority Data

Dec. 23, 1985 [JP] Japan .................. 60-287735

[51] Int. Cl.⁴ ............................. G01R 33/20
[52] U.S. Cl. ........................... 324/309; 324/312
[58] Field of Search ............. 324/300, 311, 312, 309, 324/308, 307, 320, 318, 322

[56] References Cited

U.S. PATENT DOCUMENTS 4,509,015  4/1985  Ordidge ................. 324/309
4,585,992  4/1986  Maudsley .............. 324/309
4,588,948  5/1986  Mansfield ............. 324/309

OTHER PUBLICATIONS

A. Kumar, "NMR Fourier Zeugmatography", Jour. of Mag. Res., vol. 18, 1975, pp. 69-83.

W. Dixon, "Simple Proton Spectroscopic Imaging", Radiology, vol. 153, 1984, pp. 189-194.
Edelstein, "Spin Warp NMR Imaging and Applications to Human Whole Body Imaging", Physics in Medicine and Biology, vol. 25, 1980, pp. 751-756.

Primary Examiner—Michael J. Tokar
Attorney, Agent, or Firm—Antonelli, Terry & Wands

[57] ABSTRACT

An NMR imaging method is disclosed in which an object is measured in accordance with a pulse sequence capable of expressing a difference between two of a plurality of chemical shifts by a phase difference in a signal, that is, a pulse sequence $90° - \tau_a - 180° - \tau_b$ --spin echo (where $\tau_a \neq \tau_b$) to obtain spin distribution data, a histogram with respect to the phase of the spin distribution data is formed to regard a phase corresponding to that one of a plurality of peaks of the histogram which exists at one end of the histogram, as a position-independent offset phase which is contained in the spin distribution data and is peculiar to an NMR imaging apparatus, and the spin distribution data is corrected using the offset value thus obtained, to extract spin density distribution data for each of the chemical shifts from the corrected spin distribution data.

7 Claims, 6 Drawing Sheets

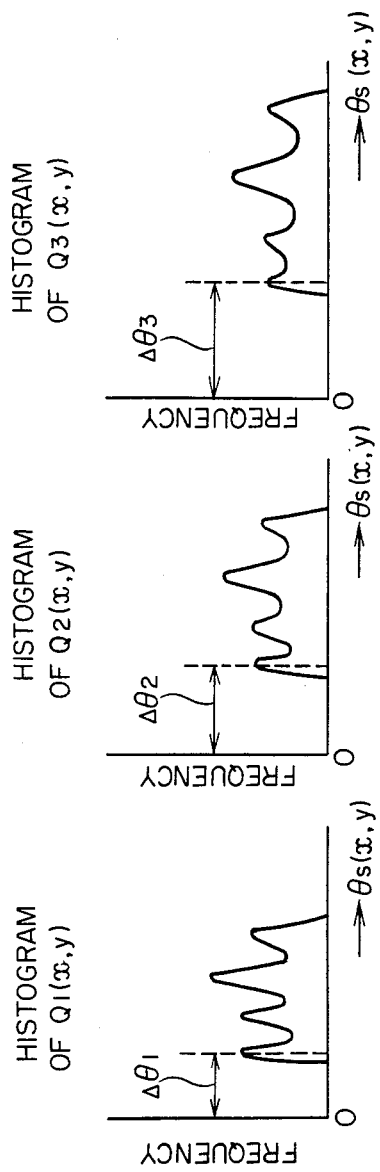

NMR IMAGING METHOD

BACKGROUND OF THE INVENTION

The present invention relates to an imaging method using nuclear magnetic resonance (hereinafter referred to as "NMR"), and more particularly to a chemical shift imaging method capable of eliminating an offset phase peculiar to an NMR imaging apparatus.

In an NMR imaging method, it is necessary to discriminate signals generated by nuclear spins in a desired portion of an object, from those in the remaining portion of the object. For this purpose, the object is placed in a predetermined static magnetic field, and a field gradient is applied to the static magnetic field so that the magnetic field intensity varies with position. That is, the resonance frequency or the degree of phase encoding is varied with position, to obtain positional information.

The fundamental principle of the above method for obtaining positional information has been reported by Kumar et al. (Journal of Magnetic Resonance, Vol. 18, 1975, page 69), and further reported by Edelstein et al. ("Physics in Medicine and Biology", Vol. 25, 1980, page 75).

An image indicating the magnetization distribution in an object, for example, a spin density distribution image with respect to the atomic nucleus of hydrogen has been first formed by the above imaging method. Further, a magnetization distribution image for each of frequency components appearing on a frequency spectrum, that is, a spin density distribution image for each of a plurality of chemical shifts has been formed by such an imaging method, in recent years.

A chemical shift is based upon a fact that a magnetic field applied to a nuclear spin is dependent upon a molecular structure around the spin, that is, the resonance frequency of a nuclear spin depends upon the position of the spin in a molecular structure. Thus, the chemical shift is a very important quantity capable of providing information on the molecular structure of an object.

A typical one of chemical shift imaging methods is proposed by Dixon ("Radiology", Vol. 153, 1984, page 189). In the above typical method, a pulse sequence $90° - \tau_a - 180° - \tau_b$-signal detection is used for obtaining a spin distribution image, and the sum of a first image for $\tau_a = \tau_b$ and a second image for $\rho_a \neq \tau_b$ and the difference between the first image and the second image are used for obtaining a spin distribution image with respect to a specified chemical shift. In the above pulse sequence, 90° indicates an RF magnetic field for inclining a nuclear spin at 90° with an original state, and 180° an RF magnetic field for inclining a nuclear spin at 180° with an original state. According to this method, a measuring time is only twice longer than a time required for obtaining a single image. Hence, the method is very practical. Further, an improved version of the method has been known, in which the measurement using the above pulse sequence is repeated while varying the time difference $\Delta \tau$ between the time intervals $\tau_a$ and $\tau_b$, and simultaneous equations formed of a plurality of image data which are obtained by the repeated measurement, are solved to obtain a spin distribution image for each of a plurality of chemical shifts. In a case where only two chemical shifts appear, image data is obtained using a pulse sequence in which the time difference $\Delta \tau$ is set to a specified value, and the real and imaginary parts of the image data are used for otaining spin distribution images for one and the other of the two chemical shifts. These methods are described in a patent application Ser. No. 846,151 (filed in the United States on Mar. 31, 1986).

In these chemical shift imaging methods, a fact that a difference between two of chemical shifts appears as a phase difference in image data, is utilized to discriminate the chemical shifts from one another. However, the image data contains an offset phase which is peculiar to an NMR imaging apparatus and cannot be removed by the adjustment thereof. Thus, image data obtained by measurement contains phase rotation due to the above offset phase, in addition to phase rotation due to chemical shifts. A reference sample inserted in an RF coil has hitherto been measured to previously detect the offset phase, and image data obtained by measuring an object is corrected using the detected offset phase, to obtain image data which does not contain an offset phase. However, the measurement of the reference sample requires time and labor, and moreover the detected offset phase is led into error by a change in measuring condition.

SUMMARY OF THE INVENTION

An object of the present invention is to provide an NMR imaging method which can accurately detect an offset phase peculiar to an NMR imaging apparatus without using a reference sample, and can perform chemical shift imaging with satisfactory accuracy.

In an NMR imaging method according to the present invention, a histogram is formed for the phases of image data (that is, complex data) which are obtained by measuring an object, an offset phase peculiar to an NMR imaging apparatus is estimated from the histogram, each image data is corrected using the estimated offset phase, and a spin density distribution image for each of chemical shifts is obtained from the corrected image data.

BRIEF DESCRIPTION OF THE DRAWINGS

FIGS. 7A, 7B and 7C are graphs showing histograms which are obtained by the embodiment of FIG. 6.

DESCRIPTION OF THE PREFERRED EMBODIMENTS

Now, embodiments of the present invention will be explained, by reference to the accompanying drawings.

Figure 1:
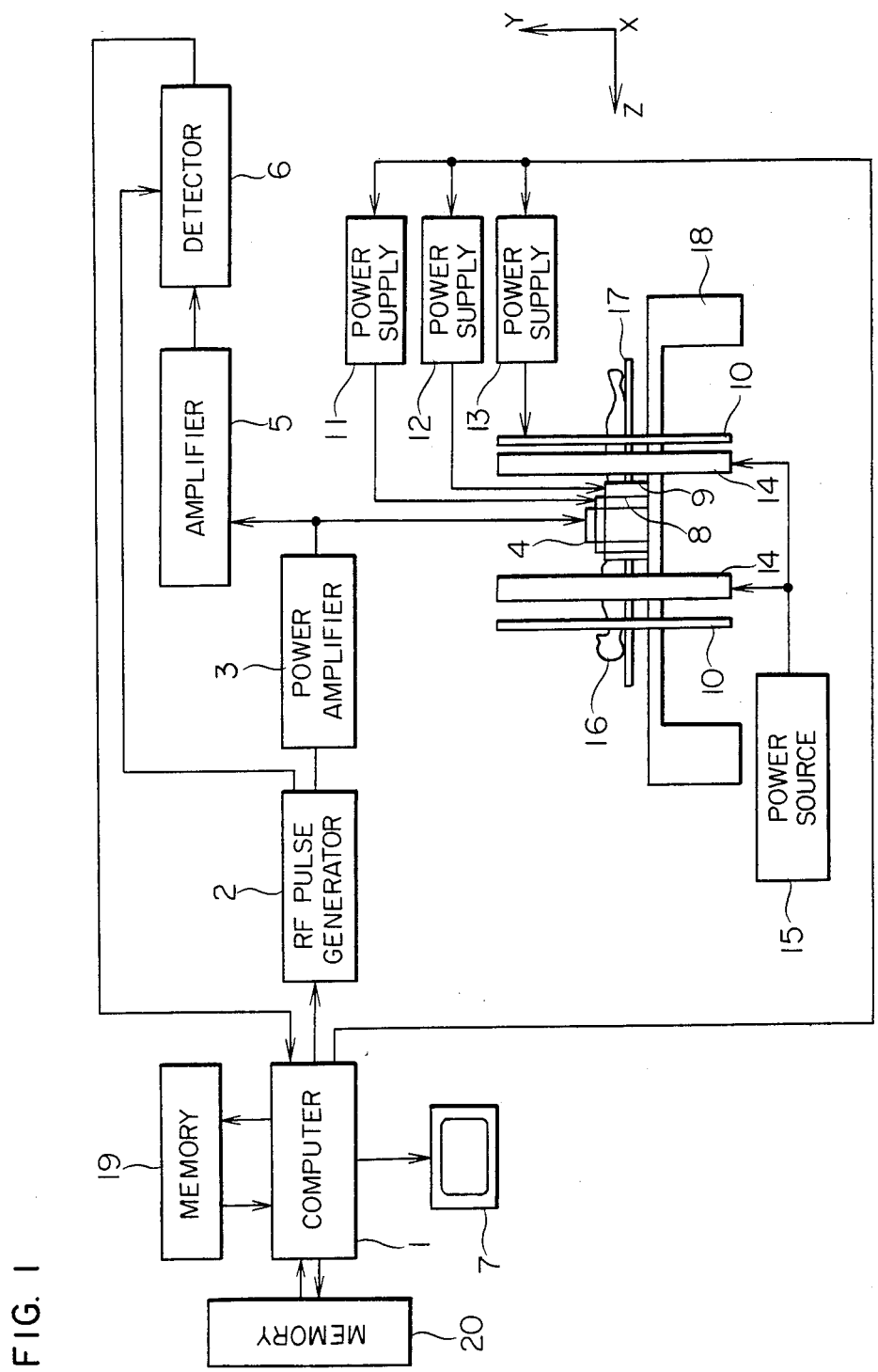
FIG. 1 is a block diagram showing an NMR imaging apparatus for carrying out the present invention.

FIG. 1 shows the construction of an apparatus for carrying out an embodiment of an NMR imaging method according to the present invention. In FIG. 1, reference numeral 1 designates a computer, 2 an RF pulse generator, 3 a power amplifier, 4 a coil for generating a high-frequency magnetic field and for detecting a signal from an object 16, 5 an amplifier, 6 a detector, 8, 9 and 10 coils for generating field gradients in Z-, X- and Y-directions, and 11, 12 and 13 power supplies for driving the coils 8, 9 and 10. The computer 1 issues various instructions to many of the above parts. An output from the RF pulse generator 2 is amplified by the power amplifier 3, the output of which is supplied, as an exciting current, to the coil 4. The coil 4 also acts as a receiving coil, and a signal recieved by the coil 4 is applied to the detector 6 through the amplifier 5, to be subjected to detection. The output of the detector 6 is processed by the computer 1, and then converted by a display 7 into an image.

Further, a static magnetic field is generated by a coil 14 which is driven by a power source 15. The object 16 to be inspected, that is, a human body is placed on a bed 17, which is slidably mounted on a holding base 18. A memory 19 is used for correcting a phase error, and another memory 20 stores measured data therein.

Figure 2:
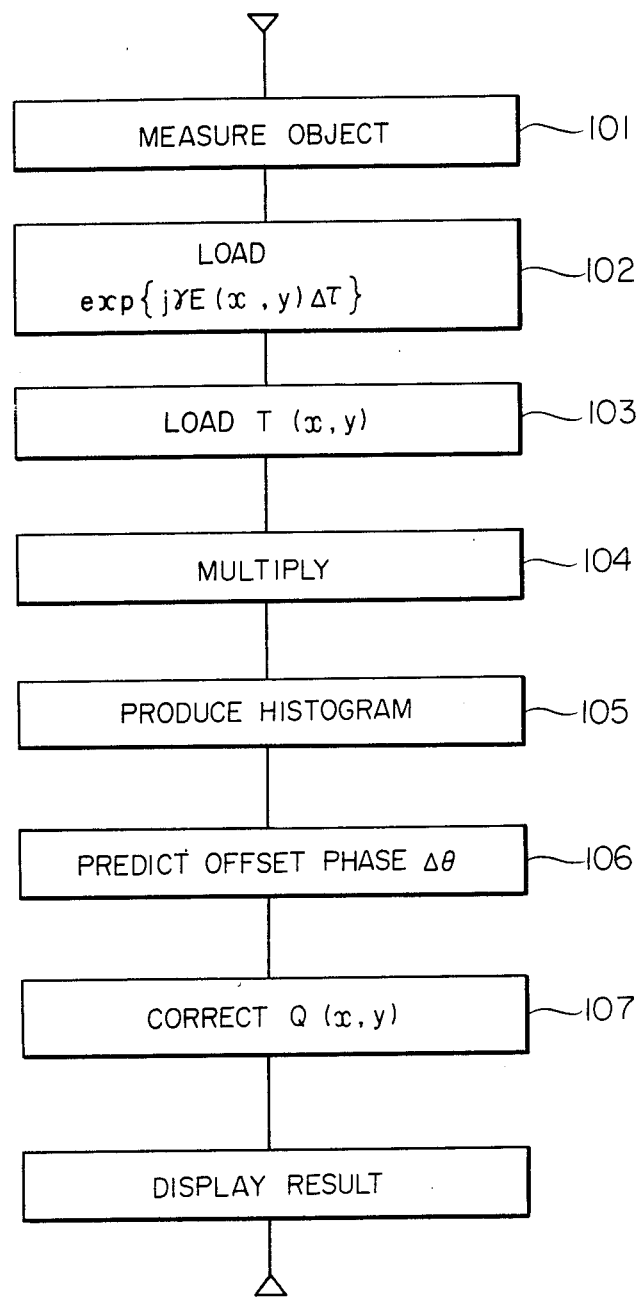
FIG. 2 is a flow chart showing an embodiment of an NMR imaging method according to the present invention.
Figures 3A, 3B, 3C, 3D:
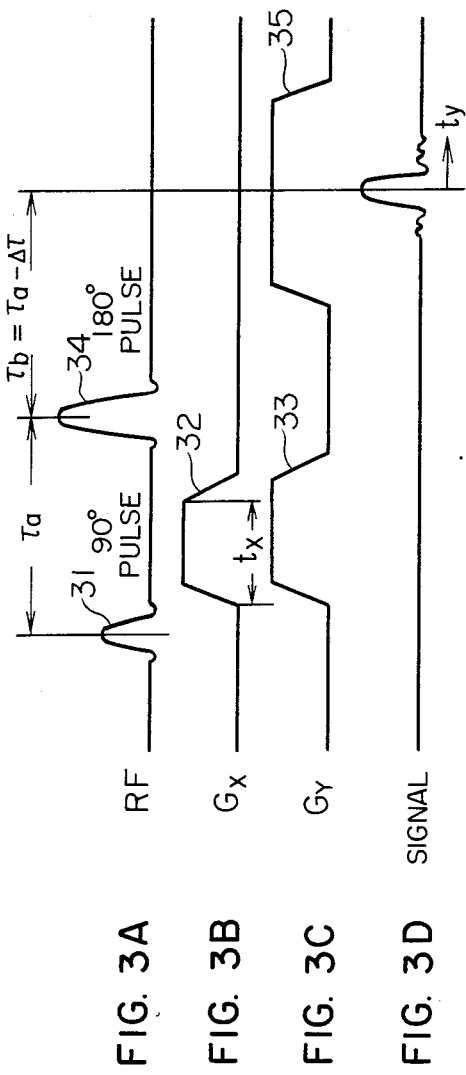
FIGS. 3A, 3B, 3C, and 3D are time charts showing a measuring sequence used in the embodiment of FIG. 2.

FIG. 2 is a flow chart showing the whole operation in an embodiment of an NMR imaging method according to the present invention. The present embodiment is used for an object in which nuclear spins of the same kind generate only two chemical shifts. Now, the present embodiment will be explained by reference to FIG. 2. In step 101, the object is measured by the apparatus of FIG. 1, to obtain two-dimensional spin data. The measurement is made by a modified two-dimensional spin warp method. FIGS. 3A to 3D show the timing of RF pulses, field gradients in X- and Y-directions and a signal from nuclear spins, in the modified spin warp method. In this case, a slice parallel to an X-Y plane is specified and data from nuclear spins in this slice is detected. In more detail, FIG. 3A shows RF pulses, FIG. 3B a field gradient $G_x$ in the X-direction, FIG. 3C a field gradient $G_y$ in the Y-direction, and FIG. 3D a signal from the nuclear spins.

First, the object 16 is placed in the static magnetic field, and is applied with a 90° RF pulse 31 of FIG. 3A, to incline each nuclear spin in the above slice at 90° to an original state. Immediately after the 90° RF pulse, the field gradient $G_x$ is applied for a period $t_x$ as indicated by reference numeral 32 in FIG. 3B. Then, a 180° RF pulse 34 is applied as shown in FIG. 3A. The time interval between the peak of the 90° RF pulse 31 and that of the 180° RF pulse 34 is set to a value $\tau_a$. The observation of the above signal is made, while applying the field gradient $G_y$ to the static magnetic field. The field gradient $G_y$ is also applied till a time 33 as shown in FIG. 3C, and thus the peak of the above signal (namely, a spin echo) is generated when a period $\tau_b (\tau_b = \tau_a - \Delta\tau)$ has elapsed after the peak of the 180° RF pulse 34 and in that duration time of the field gradient $G_y$ which terminates at a time 35.

When the two chemical shifts are expressed by $\sigma_1$ and $\sigma_2$, the time difference $\Delta\tau$ between the time intervals $\tau_a$ and $\tau_b$ is selected so that a phase difference due to $\Delta\tau$ is equal to $\pi/2$, that is, the time difference $\Delta\tau$ is set so as to satisfy the following equation:

$$\gamma(\sigma_2 - \sigma_1)\Delta\tau\pi/2 \tag{1}$$

where $\gamma$ indicates a nuclear gyromagnetic ratio, and $\sigma_1$ and $\sigma_2$ chemical shifts measured from a reference value, each of which is expressed by a magnetic field intensity.

The above-mentioned measuring sequence is repeated a plurality of times, while varying the magnitude or duration time $t_x$ of the field gradient $G_x$. Data obtained by the repeated measurement is subjected to two-dimensional Fourier transformation, to obtain nuclear spin data $T(x,y)$ at each picture element in the slice (x,y). The data $T(x,y)$ is stored in the memory 20, to complete the step 101.

The nuclear spin data $T(x,y)$ is complex data, and is given by the following equation:

$$T(x,y) = \rho_1(x,y)\exp\{-j\gamma(E(x,y) + \sigma_1)\Delta\tau\}\exp(j\theta) + \rho_2(x,y)\exp\{-j\gamma(E(x,y) + \sigma_2)\Delta\tau\}\exp(j\theta) \tag{2}$$

where $\rho_1(x,y)$ indicates the spin density distribution which is to be finally obtained for one of two chemical shifts, $\rho_2(x,y)$ the spin density distribution which is to be finally obtained for the other chemical shift, $E(x,y)$ the field-error distribution indicating the deviation of the static magnetic field intensity from a predetermined value, and $\exp(j\theta)$ a term indicating an offset phase peculiar to the NMR imaging apparatus.

In other words, the nuclear spin data $T(x,y)$ obtained by repeating the pulse sequence of FIGS. 3A to 3D and carrying out two-dimensional Fourier transformation, contains two factors $\exp(-j\gamma\sigma_1\Delta\tau)$ and $\exp(-j\gamma\sigma_2\Delta\tau)$ for indicating a phase difference corresponding to the difference between the chemical shifts $\sigma_1$ and $\sigma_2$, a factor $\exp\{-j\gamma E(x,y)\Delta\tau\}$ for indicating position-dependent phase rotation, and a factor $\exp(j\theta)$ for indicating a position-independent offset phase.

In steps 102 to 104 of FIG. 2, the position-dependent phase rotation caused by the field-error distribution $E(x,y)$ in the static magnetic field is removed from the nuclear spin data indicated by the equation (2). In more detail, the phase rotation $\exp\{-j\gamma E(x,y)\Delta\tau\}$ caused by the field-error distribution $E(x,y)$ can be obtained by forming a phantom having only a single chemical shift with the use of the same measuring sequence as shown in FIGS. 3A to 3D. The complex conjugate of the phase rotation thus obtained, that is, data $\exp\{j\gamma E(x,y)\Delta\tau\}$ is previously stored in the memory 19. In step 102, the computer 1 is loaded with the data $\exp\{j\gamma E(x,y)\Delta\tau\}$ from the memory 19. In step 103, the computer 1 is loaded with the measured nuclear spin data $T(x,y)$ from the memory 20. In step 104, the product of the data $\exp\{j\gamma E(x,y)\Delta\tau\}$ and the nuclear spin data $T(x,y)$ is calculated, and the result of the calculation is stored in the memory 20.

When the nuclear spin data which has been corrected in step 104 and stored in the memory 20, is expressed by $Q(x,y)$, the nuclear spin data $Q(x,y)$ is given by the following equation:

$$Q(x,y) = \rho_1(x,y)\exp\{-j\gamma\sigma_1\Delta\tau_1\}\exp(j\theta') + \rho_2(x,y)\exp\{-j\gamma\sigma_2\Delta\tau_2\}\exp(j\theta') \tag{3}$$

By using the equation (1), the equation (3) can be rewritten as follows:

$$Q(x,y) = \left[\rho_1(x,y) + \rho_2(x,y)\exp\left(-j\frac{\pi}{2}\right)\right]\exp(-j\gamma\sigma_1\Delta\tau)\exp(j\theta') \tag{4}$$

Figure 4A:
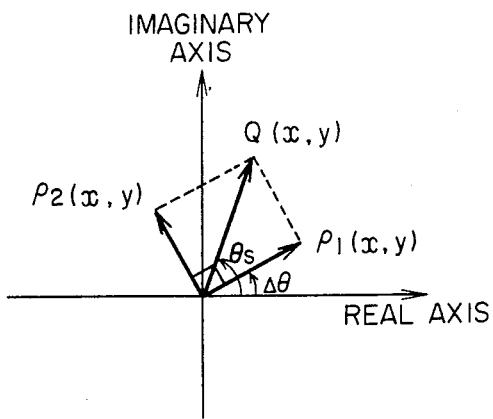
FIGS. 4A, 4B and 4C are graphs for expressing spin data which are obtained by the embodiment of FIG. 2, on a complex plane.

That is, the nuclear spin data $Q(x,y)$ at each picture element is expressed by the resultant vector of two components $\rho_1(x,y)$ and $\rho_2(x,y)$ existing on a complex plane and having a phase difference of $\pi/2$, and the component $\rho_1(x,y)$ is rotated from the real axis of the complex plane through a phase angle $\Delta\theta$ indicated by a factor $\exp(-j\gamma\sigma_1\Delta\tau)\exp(j\theta')$. FIG. 4A shows the data $Q(x,y)$ on the complex plane. The phase rotation $\Delta\theta$ is independent of the position of picture element, and includes the phase rotation caused by the chemical shift $\sigma_1$. However, not a value corresponding to the chemical shift $\sigma_1$ but a value corresponding to the difference between the chemical shifts $\sigma_1$ and $\sigma_2$ is set by the NMR imaging apparatus as indicated by the equation (1). Hence, the phase rotation $\Delta\theta$ can be regarded as an offset phase peculiar to the apparatus. Accordingly, when the offset phase $\Delta\theta$ is determined and the data Q(x,y) is corrected using the offset phase $\Delta\theta$, the real and imaginary parts of the corrected nuclear spin data are $\rho_1(x,y)$ and $\rho_2(x,y)$, respectively. Thus, a spin density distribution image can be obtained for each of the chemical shifts $\sigma_1$ and $\sigma_2$. The offset phase $\Delta\theta$ is determined in the following manner.

Figure 4B:
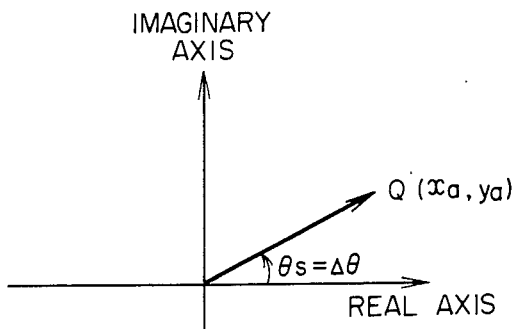
Figure 4C:
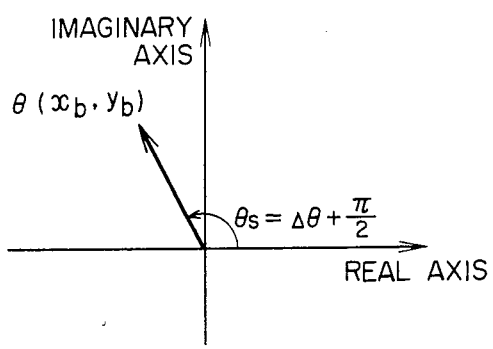
Figure 5:
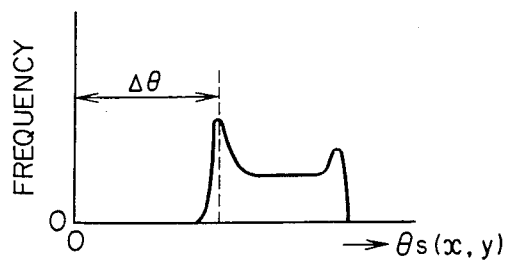
FIG. 5 is a graph showing a histogram which is obtained by the embodiment of FIG. 2.

In step 105 of FIG. 2, the computer 1 is loaded with the data Q(x,y) which is given by the equation (4), from the memory 20, and a histogram with respect to an angle $\sigma_s$ on the complex plane is produced. In more detail, both of the first chemical shift $\sigma_1$ (due to, for example, water) and the second chemical shift $\sigma_2$ (due to, for example, fat) do not always appear at each point on the specified slice of the to-be-inspected object, but only one of the chemical shifts $\sigma_1$ and $\sigma_2$ appears in a great portion of the specified slice. FIG. 4B shows data Q($x_a$,$y_a$) at a position ($x_a$,$y_a$) where only the chemical shift $\sigma_1$ appears, and FIG. 4C shows data Q($x_b$,$y_b$) at a position ($x_b$,$y_b$) where only the chemical shift $\sigma_1$ appears. The computer 1 is loaded with the real part Re[Q(x,y)] and imaginary part Im[Q(x,y)] of the data Q(x,y) at each point on the slice, computes the phase angle $\theta_s$ at each point from an equation $$\theta_s = \arctan \frac{Im[Q(x,y)]}{Re[Q(x,y)]},$$

and produces a histogram with respect to the phase angle $\theta_s$. FIG. 5 shows the histogram thus obtained, and such a histogram always has peaks corresponding to the chemical shifts $\sigma_1$ and $\sigma_2$. As can be seen from FIGS. 4B, 4C and 5, the position of a peak existing at one end of a histogram can be considered to be the offset phase $\Delta\theta$. Thus, in step 106, a phase indicated by a peak at one end of the histogram is judged to be an offset phase $\Delta\theta$ peculiar to the imaging apparatus. In step 107, the offset phase $\Delta\theta$ thus determined is used for correcting the data Q(x,y). In other words, the data Q(x,y) at every point is rotated through an angle $-\Delta\theta$. Actually, the product of the data Q(x,y) and data exp($-j\Delta\theta$) which is the complex conjugate of exp($j\Delta\theta$) is calculated at each point. Nuclear spin data Q'(x,y) which has been corrected in the above-mentioned manner, is given by the following equation:

$$Q'(x,y) = \rho_1(x,y) + \rho_2(x,y)\exp\left(-j\frac{\pi}{2}\right) \quad (5)$$

By extracting the real and imaginary parts of the data Q'(x,y), the spin density distribution $\rho_1(x,y)$ for the chemical shift $\sigma_1$ and the spin density distribution $\rho_2(x,y)$ for the chemical shift $\sigma_2$ can be obtained.

In step 108, an image indicating the spin density distribution $\rho_1(x,y)$ or $\rho_2(x,y)$ is displayed by the display 7.

As mentioned above, according to the present embodiment, a histogram of the phase angles $\theta_s$ obtained from measured data with respect to an object is formed, an offset phase peculiar to an imaging apparatus is estimated from the histogram, and the estimated offset phase is used for correcting nuclear spin data at each point of the object, to obtain an accurate spin distribution image for each of the chemical shifts $\sigma_1$ and $\sigma_2$.

In the present embodiment, the time difference $\Delta\tau$ is set so that a phase difference due to the difference between the chemical shifts $\sigma_1$ and $\sigma_2$ is equal to $\pi/2$. Alternately, the time difference $\Delta\tau$ may be set so that the above phase difference is equal to an odd multiple of $\pi/2$.

Further, in the step 105 of the present embodiment, it is not required to form the histogram of phase angles $\theta_s$ on the basis of the data Q(x,y) at all the points (namely, all the picture elements). The data Q(x,y) at every picture element in a portion where the spin density is low, has a small absolute value, and hence it is impossible to determine the phase $\theta_s$ of the above data Q(x,y) accurately. Accordingly, when the histogram is formed only from data Q(x,y) whose absolute values are greater than a predetermined value, the offset phase $\Delta\theta$ can be estimated more accurately. Alternatively, the histogram may be formed in the following manner. In order to remove data Q(x,y) in that background portion of an image field where the to-be-inspected object is absent, a portion where the to-be-inspected object is present, is previously specified, and the histogram is formed only from data Q(x,y) in the specified portion.

Further, when the intensity of static magnetic field is uniform in a great degree, the processing in steps 102 to 104 for removing the phase rotation due to the field-error distribution E(x,y), from the nuclear spin data T(x,y) may be omitted. In other words, in a case where the data Q(x,y) indicated by the equation (4) can be obtained by the processing in step 101, the processing in steps 102 to 104 can be omitted.

In the above, explanation has been made on the embodiment for an object which generates two chemical shifts. However, an NMR imaging method according to the present invention is not limited to such an object, but is applicable to an object which generates three or more chemical shifts.

Figure 6:
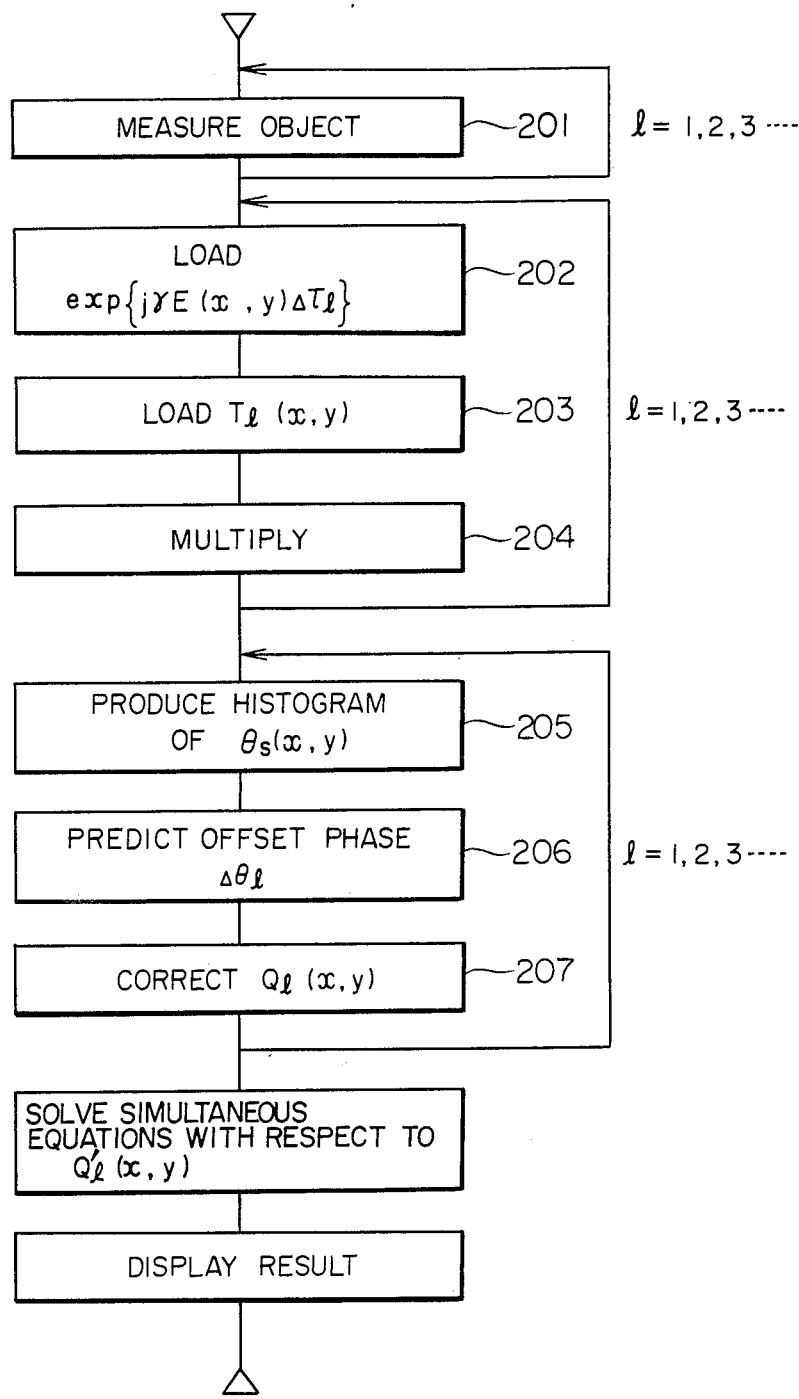
FIG. 6 is a flow chart showing another embodiment of an NMR imaging method according to the present invention.

FIG. 6 is a flow chart showing another embodiment of an NMR imaging method according to the present invention which embodiment is used for a case where three or more chemical shifts are generated.

Referring to FIG. 6, a to-be-inspected object is measured in accordance with the measuring sequence of FIGS. 3A to 3D in step 201, as in step 101. In more detail, the measuring sequence of FIGS. 3A to 3D is repeated while varying the time difference $\Delta\tau$ of FIG. 3A, that is, the above sequence is carried out for each value of $\Delta\tau_l = \tau_a - \tau_b$ (where l=1, 2, 3 ...). The nuclear spin data $T_l(x,y)$ obtained by the repeated measurement is given by the following equation:

$$T_l(x,y) = \sum_{k=1}^{n} \rho_k(x,y)\exp\{-j\gamma(E(x,y) + \sigma_k)\Delta\tau_l\}\exp(j\theta_l) \quad (6)$$

where l indicates the l-th measurement, and k the k-th chemical shift. In steps 202 to 204, the phase rotation due to the field-error distribution E(x,y) in the static magnetic field is removed from the data $T_l(x,y)$ for each value of $\Delta\tau_l$, as in steps 102 to 104. That is, the product of the data $T_l(x,y)$ and previously-determined data exp{$j\gamma E(x,y)\Delta\tau_l$} is calculated. Nuclear spin data $Q_l(x,y)$ thus obtained is expressed by the following equation:

$$Q_l(x,y) = \sum_k \rho_k(x,y)\exp(-j\gamma\sigma_k\Delta\tau_l)\exp(j\theta'_l) \quad (7)$$

In a case where the intensity of static magnetic field is uniform in a great degree, the processing in steps 202 to 204 can be omitted, because the data $Q_l(x,y)$ indicated by the equation (7) can be obtained by the processing in step 202.

The time difference $\Delta\tau_l$ can take any value, and hence is set as follows:

$$\gamma(\sigma_{m+1}-\sigma_1)\Delta\tau_l = a_{m,l}\pi \quad (8)$$

By using the equation (8), the equation (7) is rewritten as follows:

$$Q_l(x,y) = \left( \rho_1(x,y) + \sum_{k=2}^{n} \rho_k(x,y)\exp(-ja_{k-1,l}\pi) \right) \times \quad (9)$$

$$\exp(-j\gamma\sigma_1\Delta\tau_l)\exp(j\theta'_l)$$

The factor $\exp(-j\sigma_1\Delta\tau_l)\exp(j\theta'_l)$ in the equation (9) indicates an offset phase which is independent of a position in a real space (x,y) and varies with the time difference $\Delta\tau_l$. Hence, in step 205, a histogram with respect to the phase $\theta_s(x,y)$ of the data $Q_l(x,y)$ on a complex plane is formed for each value of $\Delta\tau_l$. (FIGS. 7A to 7C show histograms for data $Q_1(x,y)$, $Q_2(x,y)$ and $Q_3(x,y)$. In the present embodiment, three or more chemical shifts $\sigma_k(k=1, 2, 3, \ldots)$ are observed. Accordingly, three or more peaks usually appear on each histogram. In step 206, a phase corresponding to a peak at one end of the histogram is judged to be an offset phase $\Delta\theta_l$ peculiar to the imaging apparatus.

In step 207, the data $Q_l(x,y)$ is rotated on the complex plane through an angle $-\Delta\theta_l$, to remove the offset phase $\Delta\theta_l$ from the data $Q_l(x,y)$, thereby obtaining corrected data $Q_l'(x,y)$.

The processing in steps 205 to 207 is carried out for each of l=1, l=2, l=3 and so on. Complex data $Q_l'(x,y)$ thus obtained is expressed by the following equation $$Q_l'(x,y) = \rho_1(x,y) + \sum_{k=2}^{n} \rho_k(x,y)\exp(-ja_{k-1,l}\pi), \quad (10)$$

where $l = 1, 2, 3,$

The phase difference due to the difference between chemical shifts $\sigma_1$ and $\sigma_k$ in each measurement indicated by one value of l is previously known from the equation (8). That is, the factor $\exp(-ja_{k-1,l}\pi)$ is known. In step 208, simultaneous equations formed of a plurality of equations (10) corresponding to a plurality of values (1, 2, 3, ...) of l are solved to determine $\rho_k(x,y)$, where $k=1, 2, 3, \ldots$ Thus, the spin density distribution $\rho_k(x,y)$ for each of n chemical shifts is obtained.

In step 208, an image indicating the spin density distribution for a desired chemical shift is displayed.

As has been explained in the foregoing, according to the present embodiment, a histogram with respect to the phase of image data is formed from original image data obtained by measuring an object, or image data which is obtained by removing the phase rotation due to the inhomogeneity of static magnetic field from the original image data, and then a position-independent offset phase peculiar to an imaging apparatus is estimated from the histogram. Hence, it is not required to measure a reference sample for the purpose of detecting the offset phase, and thus an error due to a difference between the measuring condition for the object and that for the reference sample is never found in an offset phase which is estimated by the present invention. That is, the present invention provides an accurate chemical shift imaging method.

We claim:

1. An NMR imaging method for an NMR imaging apparatus for obtaining that spin density distribution in an object which corresponds to each of a plurality of chemical shifts generated by the object, comprising the steps of:

measuring the object in accordance with a pulse sequence capable of expressing a difference between two of the chemical shifts in phases of signals, wherein each of the signals includes a position-independent offset phase which is peculiar to the NMR imaging apparatus and which is desired to be eliminated;

reconstructing spin distribution data from the signals, each of the distribution data including a real part and an imaginary part;

calculating respective phases of the spin distribution data from the real part and imaginary part;

forming a histogram from the calculated phases of the spin distribution data, the histogram being function of frequency and the phases of the spin distribution data;

selecting a phase corresponding to that one of a plurality of peaks of the histogram which exits at one end of the histogram, as the position-independent offset phase;

correcting the spin distribution data in such a manner that the position-independent offset phase is eliminated from the spin distribution data; and extracting spin distribution data for each of the chemical shifts, from the corrected spin distribution data.

2. An NMR imaging method according to claim 1, wherein only those ones of a multiplicity of spin distribution daa whose absolute values are greater than a predetermined value, are used for forming the histrogram.

3. An NMR imaging method according to claim 1, wherein only those ones of a multiplicity of spin distribution data which are obtained in a specified region, are used for forming the histogram.

4. An NMR imaging method according to claim 3, wherein the specified region is that portion of an image field where the object is present.

5. An NMR imaging method for an NMR imaging apparatus for obtaining that spin density distribution in an object placed in a static magnetic field which corresponds to each of a plurality of chemical shifts generated by the object, comprising the steps of:

measuring the object in accordance with a pulse sequence capable of expressing a difference between two of the chemical shifts in phases of signals, to obtain spin distribution data of the object, wherein each of the signals includes a position-independent offset phase which is peculiar to the NMR imaging apparatus and which is desired to be eliminated:

removing phase rotation due to a field-error distribution in the static magnetic field, from the spin distribution data, to obtain a first corrected spin distribution data, each of the first correct spin distribution data including a real part and an imaginary part;

calculating respective phases of the first corrected spin distribution data rom the real and imaginary part;

forming a histogram from the calcualted phases of the first corrected spin distribution data, the histogram being a function of frequency and phases of the first corrected spin distribution data;

selecting a phase corresponding to that one of a plurality of peak of the histogram which exists at one end of the histogram:, as the position-independent offset phase;

correcting the first corrected spin distribution data in such a manner that the position-independent offset phase is eliminated form the first corrected spin distribution data, to obtain a second corrected spin distribution data; and extracting spin distribution data for each of the chemical shifts, from the second corrected spin distribution data.

6. An NMR imaging method for an NMR imaging apparatus for obtaining that spin density distribution in an object which corresponds to each of the two chemical shifts generated by the object, comprising the steps of:

measuring the object in accordance with a pulse sequence capable of expressing a difference between the two chemical shifts in phases of signals of an odd multiple of $\pi/2$ (including $\pi/2$), wherein each of the signals includes a position-independent offset phase which is peculiar to the NMR imaging apparatus and which is desired to be eliminated;

reconstructing spin distribution data from the signals, each of the spin distribution data including a real part and an imaginary part;

calculating respective phases of the spin distribution data from the real part and imarginary part;

forming a histogram with respect from the calculated phase of the spin distribution data, the histogram being a function of frequency and the phases of the spin distribution data;

selecting a phase corresponding to that one of a plurality of peaks of the histrogram which exists at one end of the histogram, as the position-independent offset phase;

correcting the spin distribution data in such a manner that the position-independent offset phase is eliminated from the spin distribution data; and using the real and imaginary parts of the corrected spin distribution data, as spin density distribution data corresponding to one of the two chemical shifts and spin density distribution data corresponding to the other chemical shift, respectively.

7. An NMR imaging method for an NMR imaging apparatus for obtaining that spin density distribution in an object placed in a static magnetic field which corresponds to each of two chemical shifts generated by the object, comprising the steps of:

measuring the object in accordance with a pulse sequence capable of expressing a difference between the two chemical shifts in phase of signals of an odd multiple of $\pi/2$ (including $\pi/2$), to obtain spin distribution data of the object, wherein each of the signals includes a position-independent offset phase which is peculiar to the NMR imaging apparatus and which is desired to be elminated;

removing phase rotation due to a field-error distribution in the static magnetic field, from the spin distribution data, to obtain a first corrected spin distribtuion data including a real part and an imaginary part;

calculating respective phases of the first corrected spin distribution data from t he real part and imaginary part;

forming a histogram with from the calculated phases of the first corrected spin distribution data, the histogram being a function of frequency and the phase of the first corrected spin distribution data;

selecting a phase corresponding to that one of a plurality of peaks of the histogram which exists at one end of the histogram, as the position-indpendent offset phase;

correcting the first corrected spin distribution data in such a manner that the position-independent offset phase is elminated from the first corrected spin distribution data, to obtain a second corrected spin distribution data, each of the second corrected spin distribution data including a real part and an imaginary part; and using the real and imaginary parts of the second corrected spin distribution data, as spin density distribution data corresponding to one of the two chemical shifts and spin density distribution data corresponding to the other chemical shift, respectively.

* * * * *